(12) United States Patent
Gabriel et al.

(10) Patent No.: US 6,593,037 B1
(45) Date of Patent: Jul. 15, 2003

(54) EUV MASK OR RETICLE HAVING REDUCED REFLECTIONS

(75) Inventors: Calvin T. Gabriel, Cupertino, CA (US); Bruno M. LaFontaine, Pleasanton, CA (US); Harry J. Levinson, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 125 days.

(21) Appl. No.: 09/847,803

(22) Filed: May 2, 2001

(51) Int. Cl.[7] .................. G03F 9/00; G21K 5/00
(52) U.S. Cl. ............................ 430/5; 378/35
(58) Field of Search .................. 430/5, 322, 323, 430/324; 378/34, 35

(56) References Cited

U.S. PATENT DOCUMENTS 6,187,484 B1 * 2/2001 Glass et al. .................. 430/5
6,395,433 B1 * 5/2002 Smith .................. 430/5
2002/0122989 A1 * 9/2002 Sterns et al. .................. 430/5

OTHER PUBLICATIONS

Pei–yang Yan et al., "*EUV Mask Absorber Characterization and Selection*," Photomask and Next–Generation Lithography Mask Technology VII, Proceedings of SPIE, vol. 4066 (2000), pp. 116–123.

* cited by examiner

Primary Examiner—S. Rosasco
(74) Attorney, Agent, or Firm—Foley & Lardner

(57) ABSTRACT

A reflective mask or reticle configured to reduce reflections from an absorptive layer during lithography at a wavelength shorter than in a deep ultraviolet (DUV) range is disclosed herein. The reflective mask or reticle is configured to generate additional reflections which have a desirable phase difference with respect to the reflections from the absorptive layer. The additional reflections reduce or eliminate the reflections from the absorptive layer by destructive interference.

22 Claims, 3 Drawing Sheets

EUV MASK OR RETICLE HAVING REDUCED REFLECTIONS

FIELD OF THE INVENTION

The present invention relates generally to integrated circuit (IC) fabrication equipment. More particularly, the present invention relates to an extreme ultraviolet (EUV) mask or reticle used in IC fabrication.

BACKGROUND OF THE INVENTION

Integrated circuit (IC) fabrication often utilizes a mask or reticle to form an image or pattern on one or more layers comprising a semiconductor wafer. Radiation is provided through or reflected off the mask or reticle to form the image on the semiconductor wafer. The wafer is correspondingly positioned to receive the radiation transmitted through or reflected off the mask or reticle. The radiation can be light at a wavelength in the ultraviolet (UV), vacuum ultraviolet (VUV), deep ultraviolet (DUV), or extreme ultraviolet (EUV) range. The radiation can also be a particle beam such as an x-ray beam, an electron beam, etc.

Typically, the image on the mask or reticle is projected and patterned onto a layer of photoresist material disposed on the wafer. The areas of the photoresist material upon which radiation is incident undergo a photochemical change to become suitably removable or fixed in a subsequent development process. In turn, the patterned photoresist material is used to define doping regions, deposition regions, etching regions, and/or other structures comprising the IC.

Radiation or lithographic wavelengths in the EUV range are being considered for next-generation lithography. EUV lithography utilizes radiation at a wavelength in the range of approximately 5 to 70 nanometer (nm) (e.g., 13.4 nm). EUV lithography requires, among others, the use of a mask or reticle specifically configured for lithographically patterning at EUV wavelengths, and is commonly referred to as an EUV mask or reticle. Unlike conventional masks or reticles which project a pattern onto the photoresist material by selective transmission of the exposure radiation, EUV masks or reticles project the pattern onto the photoresist material by selective reflection of the exposure radiation. For this reason, EUV masks or reticles are also referred to as reflective or reflective medium masks or reticles. The radiation at an EUV wavelength is reflected off the EUV mask or reticle in accordance with a pattern provided thereon and this reflected radiation is configured by components such as an EUV lens assembly before being projected onto the photoresist material.

In FIG. 1, a cross-sectional view of a portion of an EUV mask or reticle 10 is shown. EUV mask 10 includes a substrate 12, a multilayer 14, a barrier or buffer layer 16, an absorptive layer 18, and a feature 20. Multilayer 14 is disposed above substrate 12, barrier layer 16 is disposed over multilayer 14, and absorptive layer 18 is disposed over barrier layer 16.

Substrate 12 is typically a low-thermal expansion material (LTEM), such as glass. Multilayer 14 is configured to reflect radiation in the EUV wavelength range. Multilayer 14 is comprised of a plurality of films, such as 20 to 40 molybdenum-beryllium (Mo—Be) film pairs or molybdenum-silicon (Mo—Si) film pairs. The material comprising barrier layer 16 is selected to have different etch characteristics than at least absorptive layer 18. For example, barrier layer 16 can be a silicon dioxide material.

Absorptive layer 18 includes a metallic material, such as chromium. The portion of absorptive layer 18 shown in FIG. 1 comprises feature 20. Feature 20 forms a part of the pattern or image for EUV mask 10 and may also be used to etch layer 16.

Ideally, EUV mask 10 is configured to selectively reflect or absorb radiation at an EUV wavelength incident thereon to project a pattern onto the wafer. In particular, the exposed areas of multilayer 14, such as, areas 22, reflect radiation while the remaining areas of multilayer 14, such as, area 24, are covered by absorptive layer 18 to be non-reflective. Presently, however, all of the materials considered for absorptive layer 18 cause a certain amount of reflection. Moreover, as shown in FIG. 2, when a reflected ray 26 (from the top surface of absorptive layer 18) and a reflected ray 28 (from the bottom surface of absorptive layer 18) are in phase with each other, they are additive such that not only is absorptive layer 18 reflective, rather than preventing reflections, but reflections therefrom may be quite strong in intensity. In extreme cases, absorptive layer 18 can act as reflective areas of EUV mask 10 (similar to areas 22 of multilayer 14) rather than being absorbing or non-reflective areas. Hence, the pattern projected onto the wafer (i.e., the pattern defined by the reflections from EUV mask 10) may not be the desired pattern (i.e., the pattern as defined by the exposed areas of multilayer 14 and absorptive layer 18). Alternatively, the pattern projected onto the wafer may suffer from low image contrast.

Thus, there is a need for an EUV mask configured to provide improved image contrast. There is a further need for an EUV mask having an absorptive layer of conventional material that provides reduced reflectance.

SUMMARY OF THE INVENTION

One exemplary embodiment relates to a reflective mask or reticle. The mask or reticle includes an absorptive layer configured to reduce a reflection of a lithographic radiation having a wavelength shorter than in a deep ultraviolet (DUV) range by destructive interference.

Another exemplary embodiment relates to a reflective mask or reticle. The mask or reticle includes an absorptive layer. The mask or reticle further includes an anti-reflective coating (ARC) layer disposed over the absorptive layer. The ARC layer is configured to reduce a reflection of a lithographic radiation having a wavelength shorter than in a deep ultraviolet (DUV) range from the absorptive layer by destructive interference.

Still another exemplary embodiment relates to a method for reducing an absorptive layer reflection from an absorptive layer of a reflective mask or reticle. The reduction of the absorptive layer reflection is during lithography at a wavelength shorter than in a deep ultraviolet (DUV) range. The method includes generating an another reflection. The method further includes canceling the absorptive layer reflection using the another reflection.

BRIEF DESCRIPTION OF THE DRAWINGS

The exemplary embodiments will become more fully understood from the following detailed description, taken in conjunction with the accompanying drawings, wherein like reference numerals denote like elements, in which.

DETAILED DESCRIPTION OF THE EXEMPLARY EMBODIMENTS

Advantageous reflective or EUV masks configured to reduce or eliminate reflections from its absorptive layers during lithographic printing of a semiconductor wafer are provided herein. By reducing or eliminating such undesirable reflections, the mask pattern lithographically printed onto the semiconductor wafer has improved image contrast.

Figure 1:
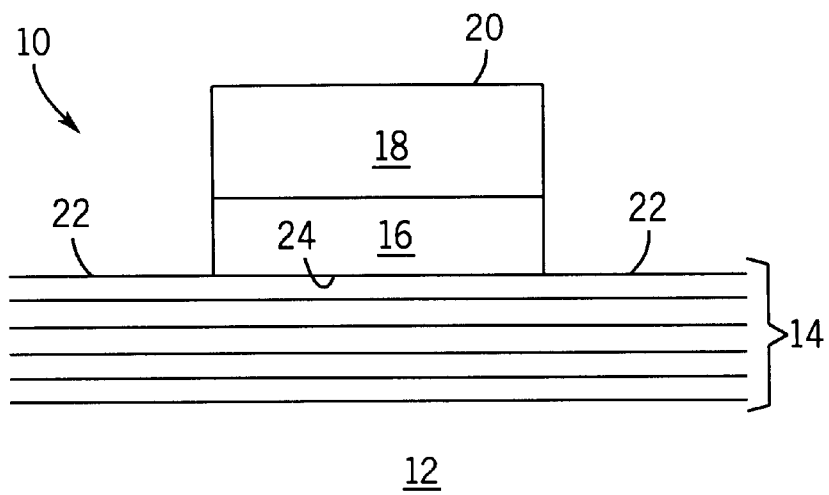
FIG. 1 is a schematic cross-sectional view of a conventional extreme ultraviolet (EUV) mask or reticle.
Figure 2:
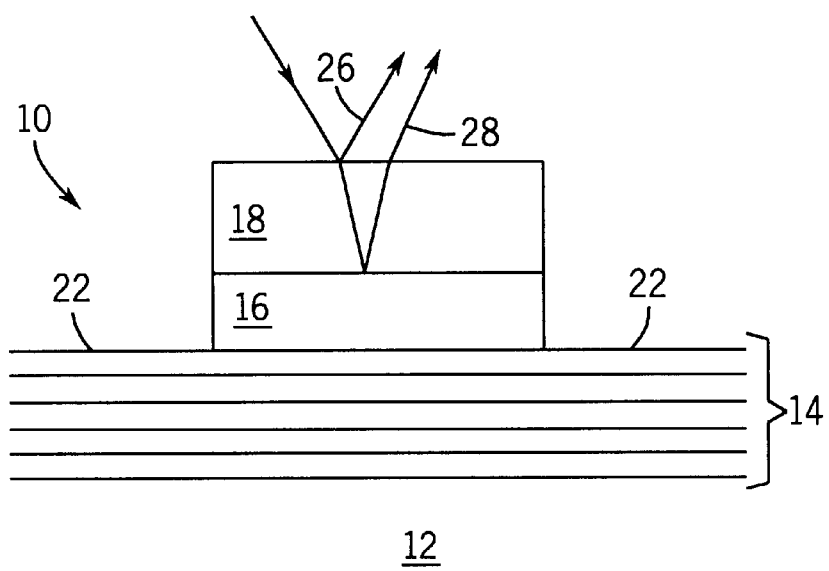
FIG. 2 is a schematic cross-sectional view of the mask or reticle illustrated in FIG. 1, showing reflectance associated with an absorptive layer of the mask or reticle.
Figure 3:
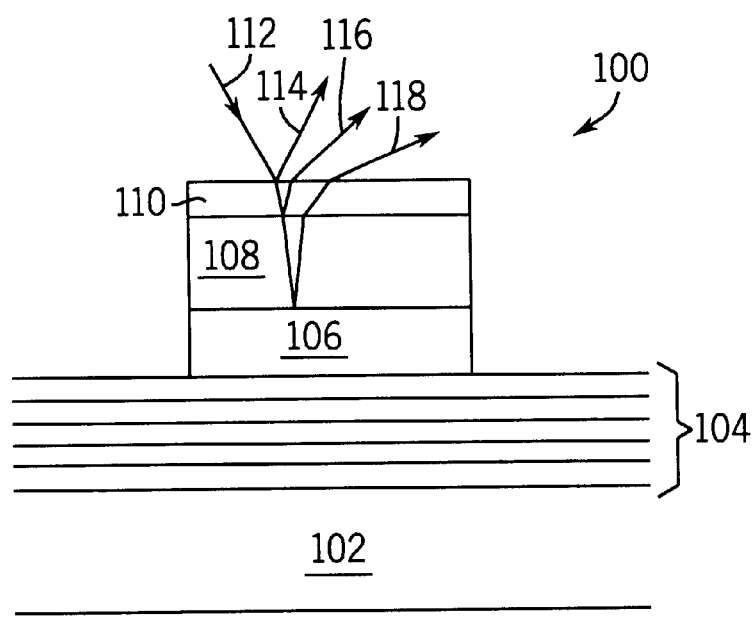
FIG. 3 is a schematic cross-sectional view of one embodiment of a reflective mask or reticle having reduced absorptive layer reflectance.

Referring to FIG. 3, there is shown an embodiment of a reflective mask or reticle 100. Mask 100 includes a substrate 102, a multilayer 104, a barrier layer 106, an absorptive layer 108, and an anti-reflective coating (ARC) layer 110. Mask 100 is configured to selectively reflect a lithographic or exposure radiation having a wavelength less than 70 nanometer (nm), and preferably between 5–14 nm, onto a semiconductor wafer coated with a layer of photoresist material (not shown). Mask 100 is also referred to as an extreme ultraviolet (EUV) mask or reticle. Alternatively, mask 100 may be utilized at other locations and/or for other purposes in an EUV or advanced lithographic system.

ARC layer 110 is provided over absorptive layer 108, and absorptive layer 108 is provided over buffer layer 106. Buffer layer 106 is provided over multilayer 104, and multilayer 104 is provided over substrate 102. Substrate 102 can be a low thermal expansion material (LTEM), such as, ultra-low expansion (ULE) glass manufactured by Corning. Alternatively, substrate 102 can be a semiconductive material, such as, silicon. In still another alternative, substrate can be a quartz, plastic, or other type of substrate.

Multilayer 104 comprises a plurality of layers or films of highly reflective types of materials. Alternating layers of molybdenum material and silicon material are configured into a stack of 40 or more molybdenum/silicon (Mo—Si) film pairs. Each film pair is configured for maximum reflectance of radiation in the EUV wavelength range. Alternatively, multilayer 104 can comprise molybdenum/beryllium (Mo—Be) film pairs. Each Mo—Si or Mo—Be film pair can be 7 nm thick. Multilayer 104 can include 40 or more film pairs and have a total thickness of 300 nm.

Buffer layer 106, also referred to as a barrier layer, preferably has different etch characteristics than each of multilayer 104 and absorptive layer 108. Buffer layer 106 can be comprised of, for example, silicon dioxide or silicon nitride at a thickness of 70 nm.

Absorptive layer 18 preferably absorbs radiation in the EUV wavelength ranges incident thereon. Absorptive layer 108 is preferably a metal layer. For example, absorptive layer 108 can be a 30–100 nm thickness of chromium, chromium oxide, titanium nitride, tantalum nitride, tantalum, titanium, or aluminum-copper.

Layers 106–110 are patterned or printed using a photoresist layer provided over ARC layer 110 (not shown). Layers 106–110 are etched in accordance with the pattern provided on the photoresist layer. Such pattern transfer to layers 106–110 can comprise one or more etch processes involving more than one etch chemistries. For example, etch chemistries for etching absorptive layer 108 may differ from etch chemistries for etching buffer layer 106. Examples of suitable etch chemistries for etching absorptive layer 108 include $Cl_2$, $BCl_3$, and HCl. Examples of suitable etch chemistries for etching buffer layer 106 include $CF_4$, $CHF_3$, and $C_4F_8$. ARC layer 110 can be provided over absorptive layer 108 by a spin-on, a chemical vapor deposition (CVD), or a plasma enhanced CVD (PECVD) process.

ARC layer 110 is configured to reduce or eliminate reflections of radiation at a wavelength shorter than deep ultraviolet (DUV) radiation, such as, EUV wavelength radiation, from at least absorptive layer 108. The optical properties and thickness of ARC layer 110 are selected such that reflections from ARC layer 10 cancels the reflections from absorptive layer 108 by destructive interference. A light ray 112 from an EUV lithographic light source (not shown) incident on mask 100 is reflected by ARC layer 110 to form a reflected light ray 114, and by a top surface and a bottom surface of absorptive layer 108 to form reflected light rays 116 and 118, respectively.

ARC layer 10 is configured so that reflected light ray 114 will be opposite in phase to at least reflected light ray 116 (i.e., an 180° phase difference between rays 114 and 116). ARC layer 110 can be further configured to also cancel a reflected light ray 118 from layer 108. Alternatively, ray 118 may be negligible in comparison to ray 116. Hence, undesirable reflections from absorptive layer 108 (e.g., ray 116) formed during lithographic patterning or printing are canceled by destructive interference with reflections from ARC layer 110 (e.g., ray 114). Due to the periodic nature of destructive interference, ARC layer 110 comprised of a given material can be any number of thicknesses. For example, ARC layer 110 can be comprised of SiON or $SiO_2$ material at a few hundred Angstroms or less thickness. In another example, ARC layer 110 can be an organic material of a few 100 Angstroms or less thickness, deposited by spin-on, CVD, or PECVD techniques. Thus, in designing or manufacturing mask 100, the type of material and/or the thickness of ARC layer 110 depends on the optical properties of absorptive layer 108 and/or the properties of the lithographic or exposure radiation (e.g., wavelength) that will subsequently be incident on mask 100 to lithographically print integrated circuit (IC) features, devices, etc. on a semiconductor wafer.

Figure 4:
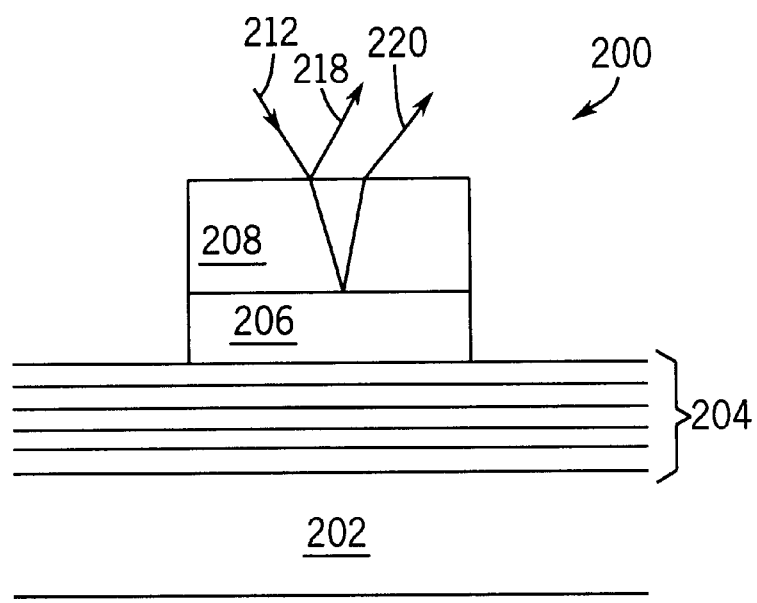
FIG. 4 is a schematic cross-sectional view of another embodiment of a reflective mask or reticle having reduced absorptive layer reflectance.

In another embodiment, a mask 200 for use in shorter wavelength lithography, such as, EUV lithography at 13.4 nm, is shown in FIG. 4. Mask 200 includes a substrate 202, a multilayer 204, a buffer layer 206, and an absorptive layer 208. Absorptive layer 208 is provided over buffer layer 206. Buffer layer 206 is provided over multilayer 204. Multilayer 204 is provided over substrate 202. Each of layers 204–208 and substrate 202 is substantially similar to layers 104–108 and substrate 102 of mask 100, respectively.

However, in mask 200, there is no ARC layer as in mask 100. Instead, the thickness of absorptive layer 208 is selected to address its own undesirable reflections. A light ray 212 from the EUV lithography light source (not shown) incident on mask 200 is reflected by a top surface of absorptive layer 208 to form a reflected light ray 218, and by a bottom surface of absorptive layer 208 to form a reflected light ray 220. Due to the thickness of absorptive layer 208, the reflections from its top surface (e.g., ray 218) and bottom surface (e.g., ray 220) are opposite in phase with respect to each other and cancel each other out by destructive interference.

Absorptive layer 208 can be comprised of SiON or $SiO_2$ material at a thickness of a few hundred Angstroms or less. Alternatively, due to the periodic nature of destructive interference, absorptive layer 208 may be any number of thicknesses for a given material. Because of this self-reflection cancellation feature in mask 200, absorptive layer 208 may also be referred to as an optimized absorptive layer.

Figure 5:
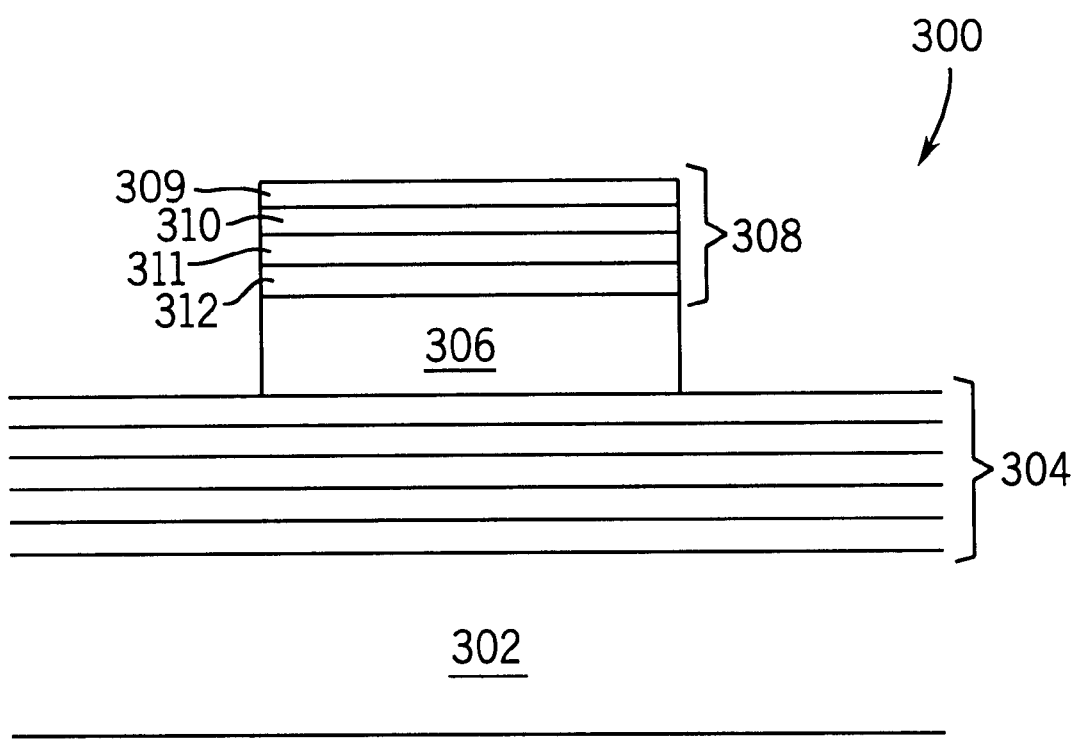
FIG. 5 is a schematic cross-sectional view of still another embodiment of a reflective mask or reticle having reduced absorptive layer reflectance.

In still another embodiment, a mask 300 for use in shorter wavelength lithography, such as, EUV lithography at 13.4 nm, is shown in FIG. 5. Mask 300 includes a substrate 302, a multilayer 304, a buffer layer 306, and an absorptive layer 308. Absorptive layer 308 is provided over buffer layer 306. Buffer layer 306 is provided over multilayer 304. Multilayer 304 is provided over substrate 302. Layers 304–306 and substrate 302 are substantially similar to layers 104–106 and substrate 102 of mask 100, respectively.

Absorptive layer 308 is comprised of two or more layers of film (e.g., films 309, 310, 311, 312) chosen to cancel each other's reflections. The reflections from films 309–312 cancel each other out due to destructive interference. Parameters associated with the films, such as, the number of films, the thickness of each of the films, the optical properties of the materials comprising the films, and/or the order of the films relative to each other, and the parameters associated with the lithographic radiation (e.g., wavelength) determine the degree of desirable destructive interference. Films 309–312 can be comprised of the same material, such as, SiON, with slight variations in the composition of the films to optimize the overall optical properties of the stack, or films 309 and 311 may be comprised of one material, such as, $SiO_2$, while films 310 and 312 are comprised of a different material, such as, $TiO_2$, to form film pairs similar to multilayer 304.

As an example, absorptive layer 308 can comprise a stack of four or more films where alternating layers are $SiO_2$ or $TiO_2$, with each individual layer, being approximately 20 to 2000 Angstroms in thickness. The exact number of films and thicknesses are selected to minimize reflections of a particular EUV wavelength.

In this manner, a drawback of materials currently used for the absorptive layer in masks used for shorter wavelength lithography, such as, EUV lithography, is addressed. Such readily available materials can now be used with its undesirable reflective property being selectively controlled. By causing undesirable reflections associated with the absorptive layer to be reduced or canceled by destructive interference, the image contrast of the mask or reticle is preserved.

It is understood that although the detailed drawings, specific examples, and particular values describe the exemplary embodiments of the present invention, they are for purposes of illustration only. The exemplary embodiments of the present invention are not limited to the precise details and descriptions described herein. For example, although particular materials or chemistries are described, other materials or chemistries can be utilized. Various modifications may be made in the details disclosed without departing from the spirit of the invention as defined in the following claims.

What is claimed is:

1. A reflective mask or reticle, the mask or reticle comprising an absorptive layer configured to reduce a reflection of a lithographic radiation having a wavelength shorter than in a deep ultraviolet (DUV) range by destructive interference.

2. The mask or reticle of claim 1, wherein the absorptive layer is comprised of a material selected from a group including chromium, chromium oxide, aluminum-copper, tantalum, tantalum nitride, titanium, and titanium nitride.

3. The mask or reticle of claim 1, wherein the absorptive layer includes a top surface and a bottom surface, and the reflection includes a top surface reflection formed at the top surface and a bottom surface reflection formed at the bottom surface.

4. The mask or reticle of claim 3, wherein the top surface reflection and the bottom surface reflection have approximately a 180 degree phase difference with respect to each other.

5. The mask or reticle of claim 4, wherein a thickness of the absorptive layer determines the phase difference between the top surface reflection and the bottom surface reflection.

6. The mask or reticle of claim 1, wherein the absorptive layer includes a plurality of films and the reflection includes a film reflection from each of the plurality of films.

7. The mask or reticle of claim 6, wherein the plurality of films are configured by at least one of a thickness, a material, and an order to cause the film reflection from each of the plurality of films to destructively interfere with each other.

8. The mask or reticle of claim 7, wherein the plurality of films is comprised of a $SiO_2$ film layer and a $TiO_2$ film layer, each of the $SiO_2$ and $TiO_2$ film layers having a thickness of approximately 20 to 2000 Angstroms.

9. The mask or reticle of claim 1, wherein the lithographic radiation has a wavelength in an extreme ultraviolet (EUV) range.

10. A reflective mask or reticle, the mask or reticle comprising:

an absorptive layer; and an anti-reflective coating (ARC) layer disposed over the absorptive layer, wherein the ARC layer is configured to reduce a reflection of a lithographic radiation having a wavelength shorter than in a deep ultraviolet (DUV) range from the absorptive layer by destructive interference.

11. The mask or reticle of claim 10, wherein an ARC reflection of the lithographic radiation from the ARC layer is approximately 180 degrees out of phase with respect to the reflection from the absorptive layer.

12. The mask or reticle of claim 11, wherein a thickness of the ARC layer is selected to control a phase difference between the ARC reflection and the reflection.

13. The mask or reticle of claim 10, wherein a thickness of the ARC layer is approximately 20 to 2000 Angstroms.

14. The mask or reticle of claim 10, wherein the ARC layer is comprised of SiON or $SiO_2$.

15. A method for reducing an absorptive layer reflection from an absorptive layer of a reflective mask or reticle during lithography at a wavelength shorter than in a deep ultraviolet (DUV) range, the method comprising the steps of:

generating an another reflection; and canceling the absorptive layer reflection using the another reflection.

16. The method of claim 15, wherein the generating step includes generating the of claim 16, wherein the generating step includes generating the another reflection from the absorptive layer.

17. The method of claim 16, wherein the generating step includes generating the another reflection from a first surface of the absorptive layer and the absorptive layer reflection from a second surface of the absorptive layer, the first surface and the second surface being substantially parallel to each other.

18. The method of claim 16, wherein the absorptive layer includes at least a first film layer and a second film layer, and the generating step includes generating the another reflection at the first film layer and the absorptive layer reflection at the second film layer.

19. The method of claim 15, wherein the generating step includes generating the another reflection from an anti-reflective coating (ARC) layer disposed over the absorptive layer.

20. The method of claim 19, wherein the generating step includes configuring a thickness of at least one of the absorptive layer and the ARC layer to cause a phase difference between the another reflection and the absorptive layer reflection to be approximately 180 degrees.

21. The method of claim 15, wherein the generating step includes generating a phase difference between the another reflection and the absorptive layer reflection of approximately 180 degrees.

22. The method of claim 15, wherein the canceling step includes destructively interfering the absorptive layer reflection with the another reflection.

* * * * *